United States Patent [19]
Gotou et al.

[11] Patent Number: 5,648,146
[45] Date of Patent: Jul. 15, 1997

[54] METALLIC WIRING SUBSTRATE

[75] Inventors: Masahito Gotou, Tenri; Hirohisa Tanaka, Ikoma-gun; Toshimasa Hamada, Yamatokoriyama, all of Japan

[73] Assignee: Sharp Kabushiki Kaisha, Osaka, Japan

[21] Appl. No.: 545,145

[22] Filed: Oct. 19, 1995

[30] Foreign Application Priority Data

Oct. 24, 1994 [JP] Japan ................. 6-258428

[51] Int. Cl.$^6$ ................. B32B 3/00; H01L 29/04; H01L 27/01
[52] U.S. Cl. ................. 428/209; 428/210; 428/901; 257/59; 257/72; 257/350; 257/761; 257/765; 437/913
[58] Field of Search ................. 427/38; 437/913; 257/59, 72, 350, 761, 765; 428/209, 210, 901

[56] References Cited

U.S. PATENT DOCUMENTS

| | | | |
|---|---|---|---|
| 4,433,004 | 2/1984 | Yonezawa | 427/38 |
| 5,202,274 | 4/1993 | Bae et al. | |
| 5,334,544 | 8/1994 | Matsuoka | 437/913 |
| 5,359,206 | 10/1994 | Yamamoto et al. | |

FOREIGN PATENT DOCUMENTS

| | | |
|---|---|---|
| 4-360580 | 12/1992 | Japan . |
| 6-27493 | 2/1994 | Japan . |
| 6-273782 | 9/1994 | Japan . |

*Primary Examiner*—Patrick Ryan
*Assistant Examiner*—Cathy F. Lam
*Attorney, Agent, or Firm*—Nixon & Vanderhye

[57] ABSTRACT

On a metallic wiring substrate, a first metallic layer is connected to a second metallic layer at a non-anodic-oxide section of the first metallic layer exposed at a bottom of a contact hole. The surface of the first metallic layer is anodically oxidized except for the non-anodic-oxide section. After resist is patterned so as to be entirely positioned on the surface of the first metallic layer, the first metallic layer is anodically oxidized, and the resist is removed therefrom. In such a manner, the non-anodic oxide section and the anodic oxide section are formed. This method makes it possible to produce the metallic wiring substrate having good insulation properties between layers easier than a method for forming the non-anodic-oxide section by etching the anodic oxide section.

6 Claims, 8 Drawing Sheets

METALLIC WIRING SUBSTRATE

FIELD OF THE INVENTION

The present invention relates to a method of producing a metallic wiring substrate obtained by providing a metal wiring on an insulating substrate, which can be utilized as a TFT substrate, etc., for example, for driving liquid crystal.

BACKGROUND OF THE INVENTION

A thin liquid crystal display apparatus which consumes less electric power has adopted an active matrix driving method which uses a thin film transistor (TFT) as an active element of liquid crystal. The liquid crystal display apparatus adopting the active matrix driving method has properties such that a responding speed of the TFT is high, high contrast is produced, and an image with high quality and with high resolution can be obtained. Therefore, the liquid crystal display apparatus is mainly used for a display section of a personal computer, a portable television, etc., and thus its market has been greatly expanded.

As to the TFT, there exist a p-Si TFT using a polysilicon (p-Si) for a semiconductor in a channel section and an a-Si TFT using an amorphous silicon (a-Si) for the semiconductor in the channel section. Since the p-Si TFT consumes less electric power and responds at higher speed compared with the a-Si TFT, it has a good prospect as the active element of the liquid crystal display apparatus which complies with the future multimedia.

In addition, since the p-Si TFT has great mobility of a carrier in silicon when a voltage is applied so as to have a desired electric field, it is possible to produce a driver circuit for driving liquid crystal having a structure that a gate driver and a source driver are arranged together with the TFT element in a picture element of the liquid crystal, namely, so-called "driver monolithic structure".

As shown in FIGS. 21 and 22, the driver circuit for driving liquid crystal with the driver monolithic structure is arranged such that a channel layer 102, a first insulating layer 103, a gate wiring 104, a gate electrode 105, an Si layer 106, a second insulating layer 107 and a source/drain electrode wiring 108 are provided on a glass substrate 101.

Furthermore, the driver circuit for driving liquid crystal with the above arrangement is produced in the following manner.

First, an Si film is formed on the glass substrate 101 by the CVD method, and the Si film is patterned so that the channel layer 102 is formed. Then, the Si film is changed to an amorphous Si film by a solid phase growth method or by irradiation of an excimer laser, and then $SiO_2$ is formed on the glass substrate 101 by the sputtering method so that the first insulating layer 103 is obtained.

Next, a metallic film such as Al, Ti is formed on the first insulating layer 103, and the metallic film is patterned so that the gate wiring 104 and the gate electrode 105 are formed. The surface of the substrate is doped with ion impurities such as phosphorus, boron with high concentration by using the gate electrode 105 as a mask so that the Si layer 106 of n+ or p+ is formed on the channel layer 102.

Successively, after SiNx as the second insulating layer 107 is formed on the whole surface of the substrate by the sputtering method, a part of the first insulating layer 103 and a part of the second insulating layer 107 are etched so that contact holes 109 . . . are formed, and a part of the gate wiring 104 and a part of the Si layer 106 are exposed.

In addition, metal such as Al, Ti is formed on the substrate where the part of the gate wiring 104 and the part of the Si layer 106 have been exposed and is patterned so that the source/drain electrode wiring 108 is formed. At this time, the source/drain electrode wiring 108 is formed such that it is connected to the gate wiring 104 and the Si layer 106 which have been exposed through the contact hole 109. In such a manner, the driver circuit for driving liquid crystal is formed.

The driver circuit for driving liquid crystal formed in the above manner has the structure that the gate driver and the source driver are formed together with the TFT in the picture element of the liquid crystal, namely the driver monolithic structure. As a result, decrease in a number of IC chips for the drivers and in installing steps can be attempted, thereby making it possible to lower cost of the liquid crystal display apparatus.

As materials used for the gate wiring 104 and the gate electrode 105 of the driver circuit for driving liquid crystal, Ta, Cr, Al or n+Si, etc. having comparatively low resistance is used. In order to solve a problem, such as delay of a signal due to enlargement of a screen, Al which has particularly low resistance is being used as the materials of the gate wiring 104 and the gate electrode 105 recently.

However, in general, when Al is heated, unevenness which is called as hillock is generated. Since the hillock causes dielectric breakdown of the insulating film and thus leakage of an electric current occurs, the generation of the hillock should be suppressed. For this reason, it is considered that Al alloy obtained by adding several % of another material to Al is used. However, the percentage of the material to be added to Al is increased in order to suppress the generation of the hillock on the Al surface, electric resistance becomes high, thereby arising a problem such as the delay of a signal.

In addition, since Al has low chemical resistance, in the case where the gate wiring 104 and the gate electrode 105 are made of Al, the gate wiring 104 and the gate electrode 105 is necessary to be protected.

Therefore, Japanese Unexamined Patent Publication No. 4-360580/1992 (Tokukaihei 4-360580) "FIELD EFFECT TRANSISTOR AND PRODUCING METHOD THEREOF" discloses a method for protecting Al such that a surface of a electrode composed of Al is anodically oxidized and thus the surface is covered with an $Al_2O_3$ film.

However, in general, in the driver circuit for driving liquid crystal, it is necessary that a signal outputted from the source/drain electrode wiring 108 of one TFT is inputted to the gate wiring 104 of another TFT and that a certain signal wiring leaps another wiring and is connected to the gate wiring 104 or the source/drain electrode wiring 108 of a certain TFT. For this reason, in the case where the gate wiring 104 and the gate electrode 105 using Al are protected by anodically oxidizing Al, in order to connect the respective electrodes in the above manner, it is necessary that $Al_2O_3$ formed on the gate wiring 104 and the gate electrode 105 is etched.

However, since the $Al_2O_3$ film has high chemical resistance, in a wet-etching method, selectivity of the $Al_2O_3$ film is inevitably smaller than of an Al film, and thus poor contact occurs due to over-etching of Al. Moreover, in dry-etching, since a gas used for etching the $Al_2O_3$ film (for example, a mixed gas of $BCl_3$ and $Cl_2$) is an etching gas for Al, the selectivity of $Al_2O_3$ to Al is reduced and thus poor contact occurs due to the over-etching of Al. Further, in the case of the dry-etching, the etching rate of the $Al_2O_3$ film is low, and thus the etching process requires much time.

Therefore, because of difficulty in etching of the $Al_2O_3$ film, it is hard to use Al for the gate wiring 104 and the gate electrode 105.

SUMMARY OF THE INVENTION

It is an object of the present invention to make it possible to selectively form an anodic oxide film on a metallic wiring by a simpler producing method.

In order to achieve the above object, the method for producing the metallic wiring substrate is characterized by including the first step of forming a first metallic layer on an insulating substrate, the second step of patterning resist so as to be entirely positioned on a surface of the first metallic layer, the third step of anodically oxidizing the first metallic layer on which the resist has been patterned, the fourth step of removing the resist from the anodically oxidized first metallic layer, and the fifth step of forming a second metallic layer so that the second metallic layer contacts with a non-anodic-oxide section of the first metallic layer.

With the above producing method, after the first metallic layer is masked with the resist, the whole surface of the first metallic layer is anodically oxidized so that the masked section can be the non-anodic-oxide section. For example, in the case where the first metallic layer is formed by using Al, when the resist is removed from the first metallic layer which has been anodically oxidized, the non-anodic-oxide section is still Al, and an $Al_2O_3$ film is formed on the unmasked section. As a result, the non-anodic-oxide section can be selectively formed on the surface of the first metallic layer without the step for etching the anodic oxide section. The anodically oxidized metal has generally high chemical resistance, so it is extremely hard to etch the metal so as to have a desired pattern, thereby easily causing over-etching. Since the above method does not require the etching of the anodic oxide section, the above method is simpler. Moreover, occurrence of a fault, such as poor contact between the first metallic layer and the second metallic layer due to the over-etching, which is apt to occur at the time of etching of the anodic oxide section, can be avoided, thereby improving yielding.

In addition, the resist formed on the first metallic layer in the second step is patterned so as to be entirely positioned on the surface of the first metallic layer. For example, on the contrary to this, when the resist spreads to an uneven section between the first metallic layer and the insulating substrate, the anodic oxidation progresses between the resist and the first metallic layer at the time of the anodic oxidation. In this case, since the area of the non-anodic oxide section becomes small, the poor contact between the first metallic layer and the second metallic layer occurs. However, when the anodic oxidation is carried out in the third step after the second step, the anodic oxidation does not progress between the resist and the first metallic layer, thereby making it possible to form the non-anodic-oxide section so as to have a desired shape according to the resist pattern.

As mentioned above, with the above producing method, the non-anodic-oxide section with a desired shape can be selectively formed on the first metallic layer by an simpler step which does not require the etching of the anodic oxide section. As a result, the poor contact between the first metallic layer and the second metallic layer is prevented, and it is possible to provide the metallic wiring substrate where insulating properties are improved in the section other than the non-anodic-oxide section. Moreover, it is possible to provide the metallic wiring substrate using metal which can be anodically oxidized, such as Al, Ta, Ti or Cr, or using alloy mainly containing the aforementioned metal as the material of the first metallic layer. Resistance of the wirings can be lowered especially by using Al.

In addition, with the above method, it is not necessary to use resist with strong adhesion to a metallic layer, and resist which is generally used in each producing steps can be used, thereby restraining an increase in the producing cost.

For fuller understanding of the nature and advantages of the invention, reference should be made to the ensuing detailed description taken in conjunction with the accompanying drawings.

BRIEF DESCRIPTION OF THE DRAWINGS

FIG. 1(a) is a plan view; and FIG. 1(b) is a sectional view taken along line A—A of FIG. 1(a).

FIG. 2(a) is a plan view; and FIG. 2(b) is a sectional view taken along line B—B of FIG. 2(a).

FIG. 3(a) is a plan view; and FIG. 3(b) is a sectional view taken along line C—C of FIG. 3(a).

FIG. 4(a) is a plan view; and FIG. 4(b) is a sectional view taken along line D—D of FIG. 4(a).

FIG. 5(a) is a plan view; and FIG. 5(b) is a sectional view taken along line E—E of FIG. 5(a).

FIG. 6(a) is a plan view; and FIG. 6(b) is a sectional view taken along line F—F of FIG. 6(a).

FIG. 7(a) is a plan view; and FIG. 7(b) is a sectional view taken along line G—G of FIG. 7(a).

DESCRIPTION OF THE EMBODIMENTS

EMBODIMENT 1

The following will explain one embodiment of the present invention referring to FIGS. 1 through 7.

Figure 1A:
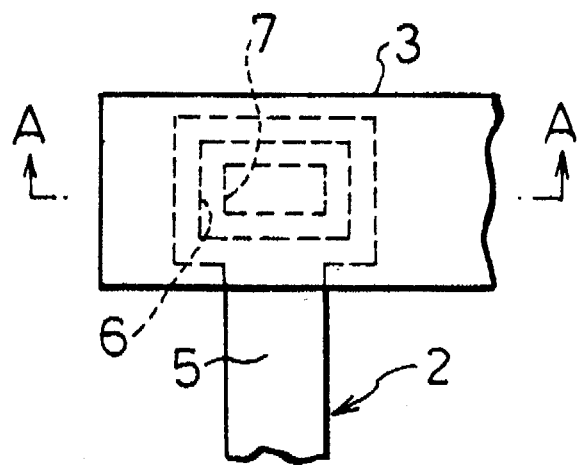
FIGS. 1(a) and 1(b) show a metallic wiring substrate of one embodiment of the present invention.
Figure 1B:
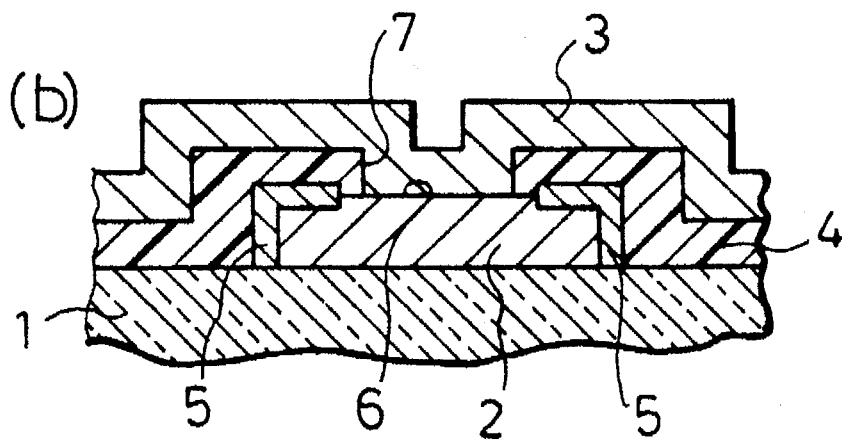

As shown in FIGS. 1(a) and 1(b), a metallic wiring substrate of the present embodiment is arranged so as to include a glass substrate 1 as an insulating substrate, a first metallic layer 2 and a second metallic layer 3 which composes a metallic wiring, and an insulating layer 4 for insulating metallic layers 2 and 3.

The first metallic layer 2 is formed on the glass substrate 1, and the surface of the first metallic layer 2 other than the contact surface with the glass substrate 1 is composed of an anodic oxide section 5 which has been anodically oxidized and a non-anodic-oxide section 6 which has not been anodically oxidized. Moreover, a contact hole 7 with a rectangular opening which exposes the non-anodic-oxide section 6 of the first metallic layer 2 is formed on the insulating layer 4.

The second metallic layer 3 is formed so as to contact with the non-anodic-oxide section 6 of the first metallic layer 2, which is exposed through the contact hole 7 formed on the insulating layer 4. Moreover, as shown in FIG. 1(a), the non-anodic-oxide section 6 is formed so that its outer circumference is surrounded by the anodic oxide section 5 on the surface of the first metallic layer 2. As a result, it is possible to securely make the first metallic layer 2 contact with the second metallic layer 3 in the contact hole 7 and to improve the insulation properties between the first metallic layer 2 and the second metallic layer 3 on a portion other than the contact portion.

Here, the following will explain the method for producing the metallic wiring substrate.

First, Al which is anodically oxidizable metal, for example, is formed on the whole surface of the glass substrate 1 by the sputtering method and the like so as to have a thickness of 300 nm. Thereafter, patterning of a resist film using OFPR800 made by Tokyo Ohka Kogyo Co., Ltd. is carried out on the whole surface of the Al layer formed on the glass substrate 1 and etching is carried out thereon so that the first metallic layer 2 made of Al is formed.

Figure 2A:
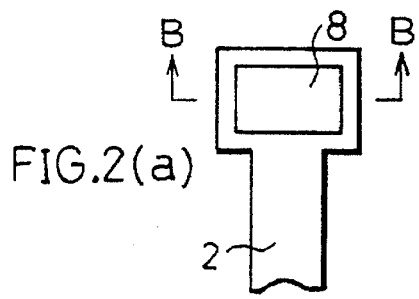
FIGS. 2(a) and 2(b) show a method for producing the metallic wiring substrate.
Figure 2B:
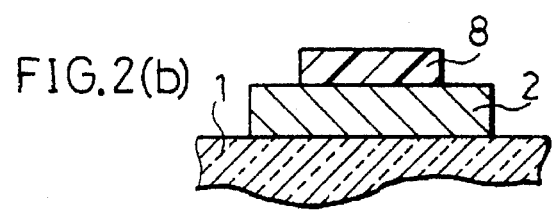

Next, as shown in FIGS. 2(a) and 2(b), resist 8 is patterned on the first metallic layer 2. In order to reduce time and cost of the production, it is desirable that resist used for another steps, for example, the resist, which is same as used in the step of forming the first metallic layer 2, is used as the resist 8. Moreover, the resist 8 functions as a protective film at the time of the anodic oxidation of Al, mentioned later, and a section of the metallic layer, which is covered with the resist 8 is not anodically oxidized. In other words, the section covered with the resist 8 becomes the non-anodic oxide section 6 shown in FIG. 1.

In addition, the resist 8 patterned on the first metallic layer 2 should be formed such that the resist 8 is entirely positioned on the surface of the first metallic layer 2, more preferably, as shown in FIG. 2(a), the outer edge of the resist 8 is positioned inside the outer edge of the first metallic layer 2. As a result, when the first metallic layer 2 is anodically oxidized, the oxide film is prevented from progressing under the resist 8 (hereinafter referred to as penetration), and thus there is no possibility of breaking the resist pattern. Incidentally, its reason will be mentioned later.

Successively, the first metallic layer 2 on which the patterning of the resist 8 has been carried out is anodically oxidized under the following conditions.

A formation fluid is a solution obtained by mixing 3% ammonium tartrate solution with ethylene glycolin in the ratio 1:9. In the case where acid solution or alkaline solution is used as the formation fluid, a porous film with bad insulation properties is formed, but when the above solution is used as the formation fluid, a close film with good insulation properties can be formed.

The formation temperature is 10° C., the formation voltage is 80 V and the initial current density is not less than 0.2 mA/cm$^2$, and fifteen minutes after the voltage becomes constant, the formation is completed. An penetrating amount at the time of the anodic oxidation, namely, an amount that the metallic surface between the resist 8 and the first metallic layer 2 is anodically oxidized, becomes larger as the formation time becomes longer. Therefore, it is desirable that a total voltage applying time does not exceed one hour.

Figure 3A:
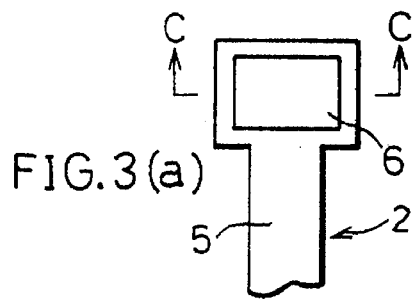
FIGS. 3(a) and 3(b) show the method for producing the metallic wiring substrate.
Figure 3B:
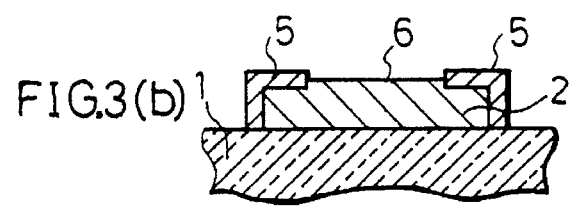

Next, after the above-mentioned anodic oxidation is completed, when the resist 8 is removed from the first metallic layer 2, as shown in FIGS. 3(a) and 3(b), the anodic oxide section 5 made of an $Al_2O_3$ film is formed on the section of the first metallic layer 2 which has not been covered with the resist 8. Moreover, the section of the first metallic layer 2 which has been covered with the resist 8 becomes the non-anodic-oxide section 6 where Al is exposed.

Figure 4A:
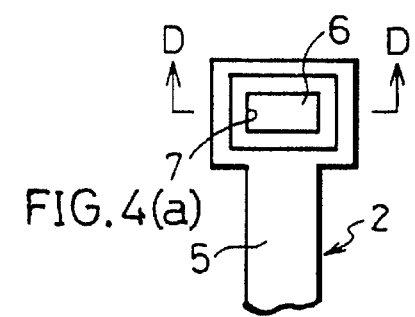
FIGS. 4(a) and 4(b) show the method for producing the metallic wiring substrate.
Figure 4B:
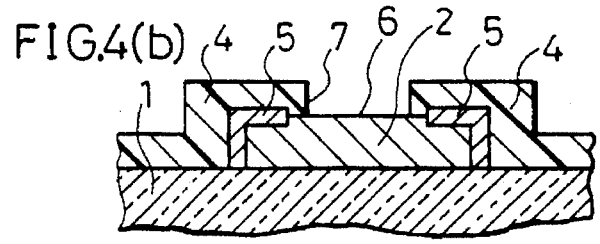

Successively, the insulating layer 4 is obtained such that SiNx, for example, is formed so as to have a thickness of 300 nm on the whole surface of the glass substrate 1 on which the first metal layer 2 has been formed. Then, the insulating layer 4 on the non-anodic-oxide section 6 of the first metallic layer 2 is etched, and as shown in FIGS. 4(a) and 4(b), the contact hole 7 is formed on the insulating layer 4 so that the non-anodic-oxide section 6 is exposed.

Figure 5A:
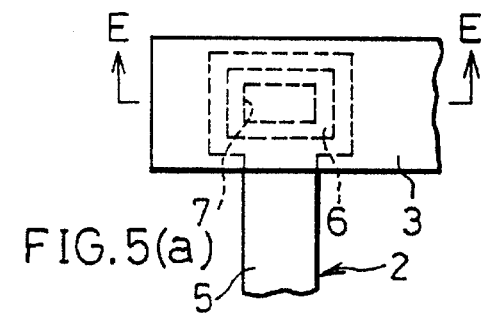
FIGS. 5(a) and 5(b) show the method for producing the metallic wiring substrate.
Figure 5B:
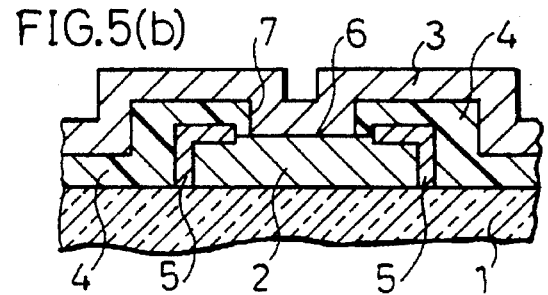

Finally, Al is formed on the insulating layer 4, in which the contact hole 7 has been formed, so as to have a thickness of 300 nm by the sputtering method, etc., and after the resist film is patterned thereon, the etching is carried out. As a result, as shown in FIGS. 5(a) and 5(b), the second metallic layer 3 is formed. The second metallic layer 3 contacts with the non-anodic-oxide section 6 of the first metallic layer 2 exposed in the bottom section of the contact hole 7 on the insulating layer 4.

As mentioned above, the metallic wiring substrate shown in FIG. 1 is produced by the step of forming the first metallic layer 2 on the glass substrate 1, the step of patterning the resist on the first metallic layer 2, the step of anodically oxidizing the first metallic layer 2, the step of forming the contact hole 7 on the insulating layer 4, which has been formed on the whole surface of the substrate, for exposing the non-anodic-oxide section 6 of the first metallic layer 2 and the step of forming the second metallic layer 3 so as to contact with the non-anodic-oxide section 6 of the first metallic layer 2 exposed through the contact hole 7.

With the above producing method, before the first metallic layer 2 is anodically oxidized, the patterning of the resist 8 is carried out on the first metallic layer 2. Therefore, the section of the first metallic layer 2 covered with the resist 8 is not anodically oxidized (this is the non-anodic-oxide section 6). As a result, after the anodic oxidation, Al is exposed as the non-anodic-oxide section 6 without etching the anodic oxide section 5 composed of the $Al_2O_3$ film, which has been formed on the first metallic layer 2. For this reason, the step of etching the $Al_2O_3$ film can be eliminated. Therefore, the a number of steps of the method for producing the metallic wiring substrate can be reduced, thereby making it possible to lower the time and the cost of the production.

In addition, in the metallic wiring substrate produced by the above method, the anodic oxide section 5 composed of the $Al_2O_3$ film is formed so as to cover the whole surface of the substrate except for the non-anodic-oxide section 6 of the first metallic layer 2, so it is not necessary to provide another member with excellent insulation properties and excellent chemical resistance, which protects the first metallic layer 2.

In addition, besides the anodic oxide section 5, the non-anodic-oxide section 6 is formed on the first metallic layer 2 and the first metallic layer 2 is connected to the second metallic layer 3 on the non-anodic oxide section 6, so secure contact can be obtained.

Here, as shown in FIG. 2(a), the following will discuss the reason to form the resist 8 formed on the first metallic layer 2 so that it is entirely positioned on the surface of the first metallic layer 2, more preferably, the outer edge of the resist 8 is positioned inside the outer edge of the first metallic layer 2.

Figure 6A:
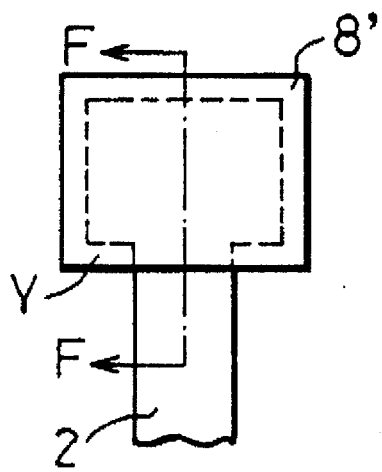
FIGS. 6(a) and 6(b) show a comparative example of the method for producing the metallic wiring substrate.
Figure 6B:
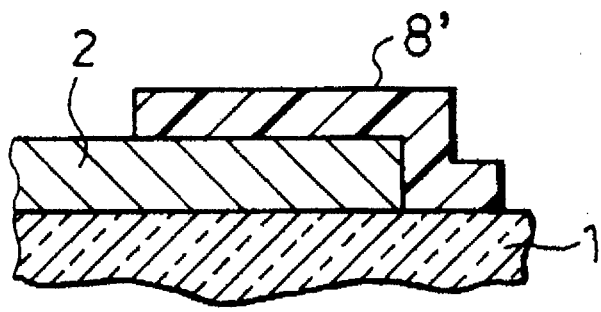
Figure 7A:
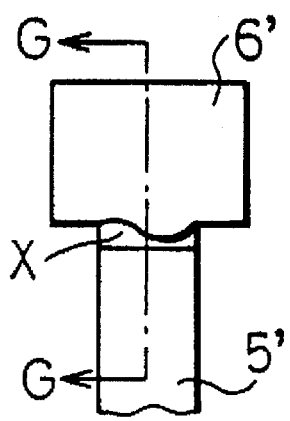
FIGS. 7(a) and 7(b) show a comparative example of the method for producing the metallic wiring substrate.
Figure 7B:
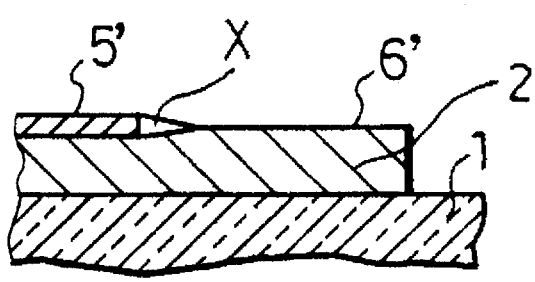

For example, as shown in FIGS. 6(a) and 6(b), in the case where the first metallic layer 2 is anodically oxidized with resist 8' exceeding the surface of the first metallic layer 2, namely, it spreads to the glass substrate 1 which is base coat, as shown in FIGS. 7(a) and 7(b), an anodic oxide section 5' and a non-anodic-oxide section 6' are formed, but the anodic oxidation progresses into the section covered with the resist 8' (represented by X in the drawing).

The progress of the anodic oxidation into the section to be protected by the resist 8', namely, the penetration is apt to occur in the vicinity of a section represented by Y in FIG. 6(a) where the width of the first metallic layer 2 changes (hereinafter, referred to as an uneven section Y). More specifically, it was found by the inventors of the present invention that the penetration occurs in the vicinity of the section on which the resist 8' has been patterned extending over an uneven section between the first metallic layer 2 and the glass substrate 1. The penetration spreads 2 to 3 µm or in some cases, not less than 10 µm from the edge of the resist 8'. When the pattern which is protected by the resist 8' is large, there exist not problems, but in the case where fine processing is carried out in the semiconductor device, etc., namely, the case where a contact portion, where each metallic wiring is connected, cannot be formed largely, the penetration of even several µm causes poor contact.

In addition, in order to prevent the penetration, it is considered that resist with strong adhesion to the first metallic layer 2, such as Photoneece® made by Toray Industries, Inc., which is negative resist disclosed in Japanese Unexamined Patent Publication No. 6-27493/1994 (Tokukaihei 6-27493) is used.

However, in order to obtain prescribed adhesion, namely, the adhesion for restraining generation of the penetration at the time of the anodic oxidation, the Photoneece® requires annealing at high temperature of not less than 300° C. For this reason, at the time of annealing, hillock occurs very possibly on Al which is the material of the first metallic layer 2, thereby causing dielectric breakdown of the metallic wiring substrate, etc.

In addition, besides the above problem, residue is apt to be left at the time of removal, so it is hard to remove the Photoneece® completely, and in order to completely remove the Photoneece®, long time $O_2$ ashing is required. Therefore the producing time is prolonged. Furthermore, since the Photoneece® is negative resist, its resolution is low and fining is hard.

In addition, also in the case of another resist with strong adhesion, there likely arises the problem similar to the above-mentioned Photoneece®. Moreover, since special treatment is necessary for obtaining strong adhesion, the producing steps become complex, and cost of the production is increased.

On the contrary, in the present embodiment, as shown in FIGS. 2(a) and 2(b), the resist 8 is formed such that it is entirely positioned on the surface of the first metallic layer 2, more preferably, an outer edge of the resist 8 is positioned inside the outer edge of the first metallic layer 2. As a result, the penetration in the vicinity of the uneven section Y on the first metallic layer 2 shown in FIG. 6(a) can be eliminated. Therefore, as shown in FIGS. 3(a) and 3(b), it is possible to form the non-anodic-oxide section 6, which is capable of maintaining a desired pattern without the penetration of the anodic oxidation, on the first metallic layer 2.

In addition, if the resist 8 is patterned in the above manner, since the resist material which is same as that of the resist used in the normal process can be used as the resist 8, the patterning of the resist can be carried out by the normal process. As a result, the cost of the production can be decreased compared with the case where resist with strong adhesion, such as Photoneece®, which requires a long treatment time is used.

Here, in the present embodiment, Al was used as the first metallic layer 2, but the first metallic layer 2 is not limited to this. Therefore, also when metal which can be anodically oxidized, such as Ta, Ti, Cr, or metal alloy mainly containing metal such as Al, Ta, Ti, Cr is used, the effect same as that in the present embodiment can be obtained.

In addition, the method for producing the metallic wiring substrate is not limited to the present embodiment, so any method is acceptable as long as it shows the above effect.

Furthermore, with the metallic wiring substrate having the above arrangement, when the gate electrode or the source/drain electrode of the thin film transistor (TFT) is connected to the first metallic layer 2 and the second metallic layer 3 which are the metal wirings, the semiconductor device having the TFT can be produced. The semiconductor device having the TFT will be mentioned in the following embodiment 2.

EMBODIMENT 2

The following will discuss another embodiment of the present invention referring to FIGS. 8 through 20. Here, the present embodiment will discuss a semiconductor device as another example of the metallic wiring substrate of the present invention and its producing method. Moreover, the semiconductor device is used as a driver circuit for driving liquid crystal of a liquid crystal display apparatus using the TFT as a driving element.

Figure 8:
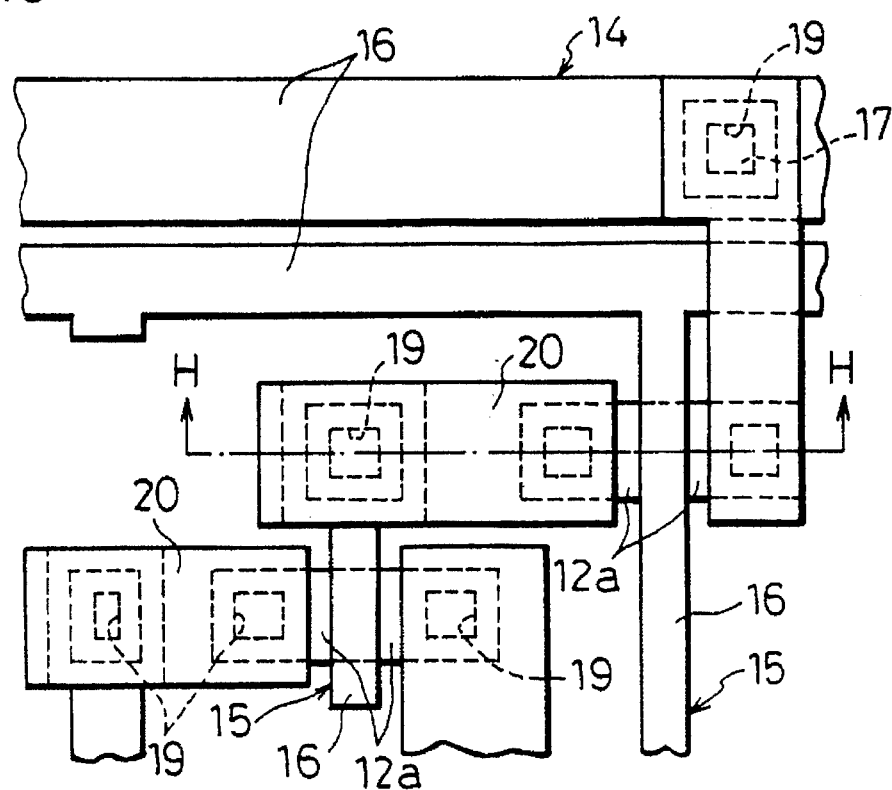
FIG. 8 is a plan view which shows a semiconductor device as another embodiment of the present invention.
Figure 9:
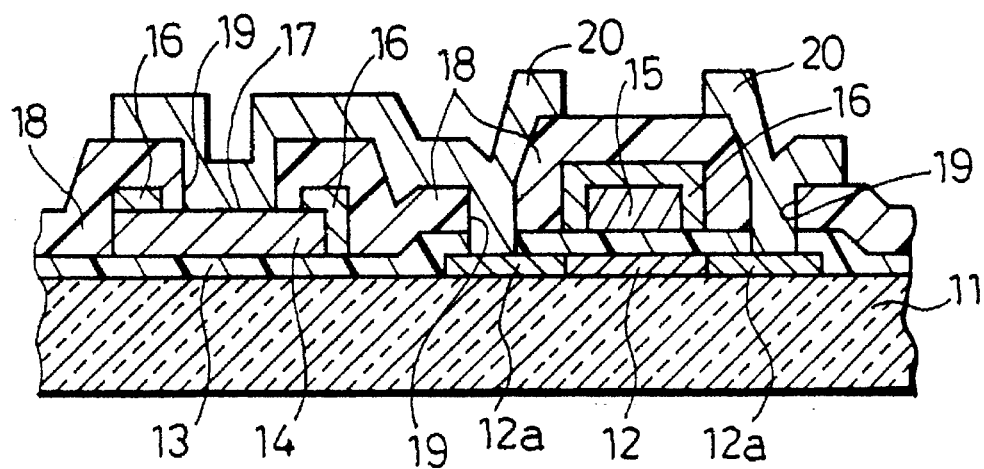
FIG. 9 is a sectional view taken along line H—H of the semiconductor device of FIG. 8.

As shown in FIGS. 8 and 9, the semiconductor device of the present embodiment includes a glass substrate 11 as an insulating substrate, a channel layer 12, n+Si or p+Si layer 12a, and a first insulating layer 13. Here, the channel layer 12 is formed on the glass substrate 11 and is made of Si. Moreover, the n+Si or p+Si layer 12a is an Si layer formed by doping impurity, such as phosphorus, boron, with high concentration by the ion doping method. The first insulating layer 13 is an $SiO_2$ layer formed on the whole surface of the substrate.

Furthermore, the semiconductor device includes a gate wiring 14 as the metallic wiring, a gate electrode 15, a metallic oxide layer 16, a non-anodic-oxide section 17, a second insulating layer 18, a contact hole 19, and a source/drain electrode wiring 20. The gate wiring 14 and the gate electrode 15 are composed of metal which can be anodically oxidized. The metallic oxide layer 16 is an anodic oxide section formed by anodically oxidizing the gate wiring 14 and the gate electrode 15. The non-anodic-oxide section 17 is a section on the surface of the gate wiring 14 which is not anodically oxidized. The second insulating layer 18 is an SiNx layer formed on the whole surface of the substrate. In order to expose the non-anodic-oxide section 17 of the gate wiring 14 and to expose the n+Si or P+Si layer 12a, the contact hole 19 is formed on the first insulating layer 13 and the second insulating layer 18. The source/drain electrode wiring 20 is connected to the n+Si or p+Si layer 12a and the non-anodic-oxide section 17 of the gate wiring 14 which are exposed through the contact hole 19. Here, the non-anodic-oxide section 17 has a shape such that its outer circumference is surrounded by the metallic oxide film 16 on the surface of the gate wiring 14.

Figure 20:
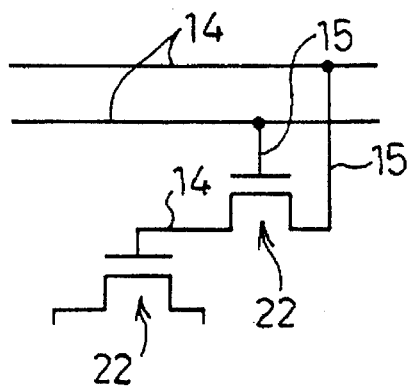
FIG. 20 is a diagram which shows an equivalent circuit of the semiconductor device in FIG. 8.
Figure 21:
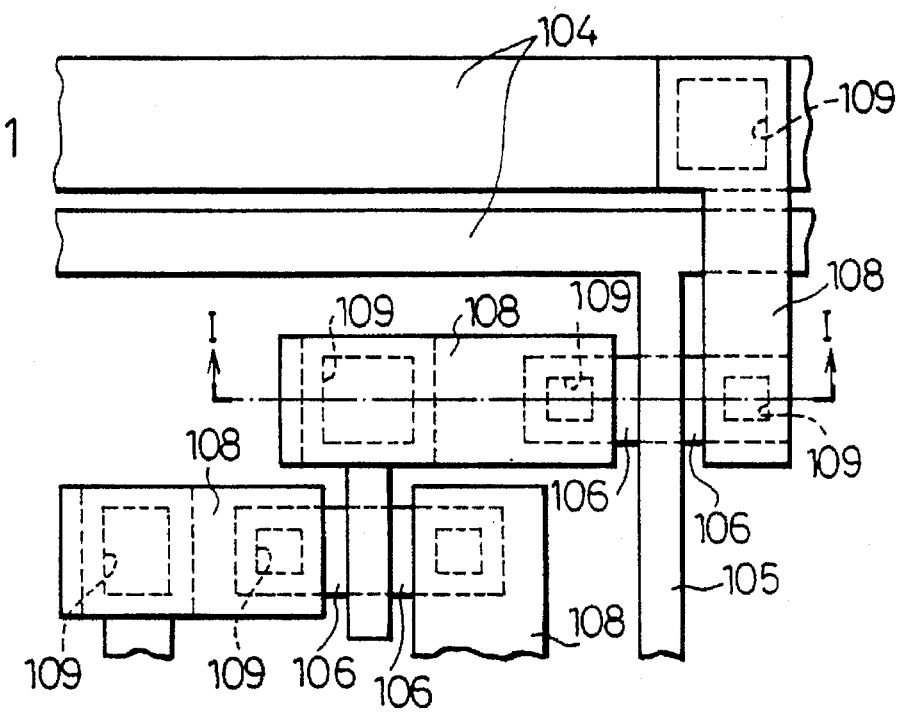
FIG. 21 is a plan view of a conventional semiconductor device.
Figure 22:
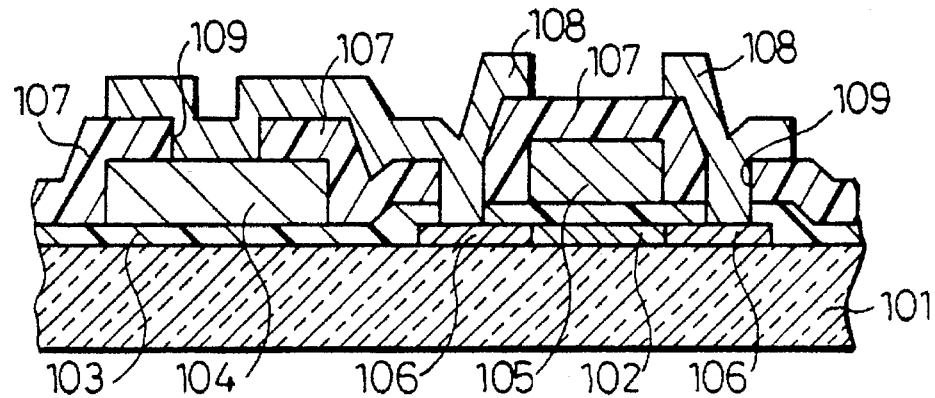
FIG. 22 is a sectional view taken along line I—I of the semiconductor device in FIG. 21.

As shown in FIG. 20, the semiconductor device with the above arrangement is represented by an equivalent circuit having two TFTs 22.

Here, the following will discuss the method for producing the semiconductor device with the above arrangement.

First, after Si is formed by the vacuum CVD method on the whole surface of the glass substrate 11 so as to have a thickness of 50 to 150 nm, the Si is polycrystallized by a solid phase growth method for heating the Si at 600° C. for 24 hours or by a method for fusing and solidifying the Si using the excimer laser, etc., for example.

Thereafter, a resist film using OFPR800 made by Tokyo Ohka Kogyo Co., Ltd., for example, is patterned on the surface of the Si layer formed on the glass substrate 11 and etching is carried out thereon so that the channel layer 12 is formed. Here, in the reverse order of the above procedure, the channel layer 12 may be polycrystallized after the patterning.

Figure 10:
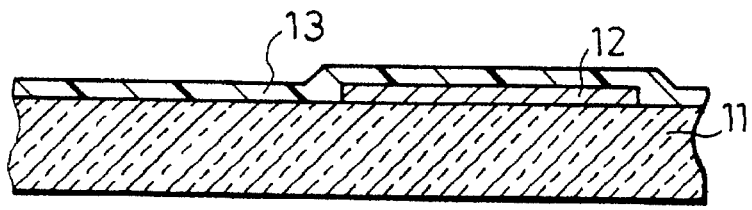
FIG. 10 is a sectional view of the halfway produced semiconductor device which shows the method for producing the semiconductor of FIG. 8.

Next, as shown in FIG. 10, the $SiO_2$ film having a thickness of 100 nm is formed by the sputtering method or the TEOS method, etc., on the whole surface of the glass substrate 11 on which the channel layer 12 has been formed, so as to be the first insulating layer 13.

Figure 11:
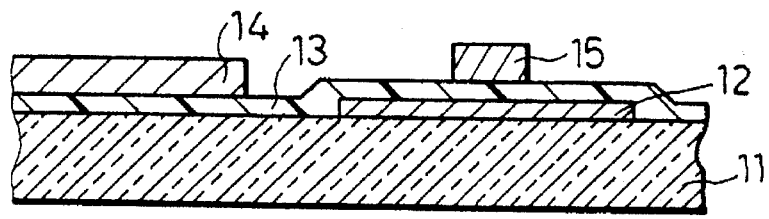
FIG. 11 is a sectional view of the halfway produced semiconductor device which shows the method for producing the semiconductor of FIG. 8.
Figure 16:
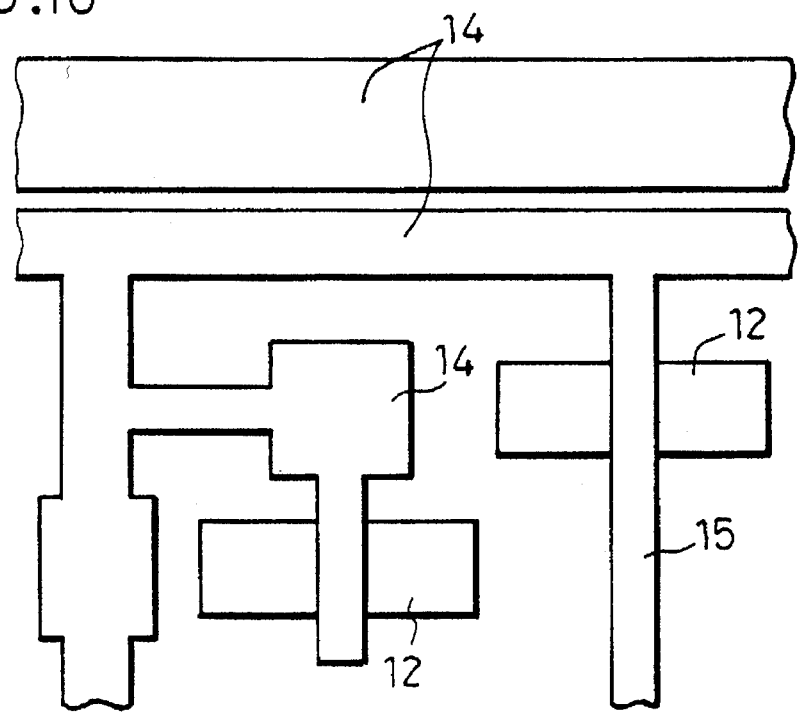
FIG. 16 is a plan view of the halfway produced semiconductor device which shows the method for producing the semiconductor device of FIG. 8.

Successively, after Al, for example, is formed as the metal which can be anodically oxidized, patterning and etching are carried out thereon so that the gate wiring 14 and the gate electrode 15 are formed as shown in FIGS. 11 and 16.

Figure 12:
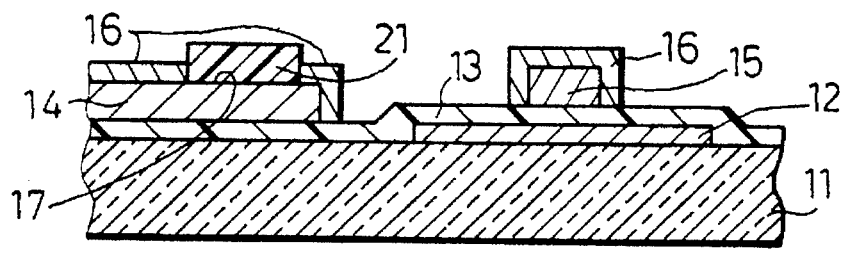
FIG. 12 is a sectional view of the halfway produced semiconductor device which shows the method for producing the semiconductor of FIG. 8.
Figure 13:
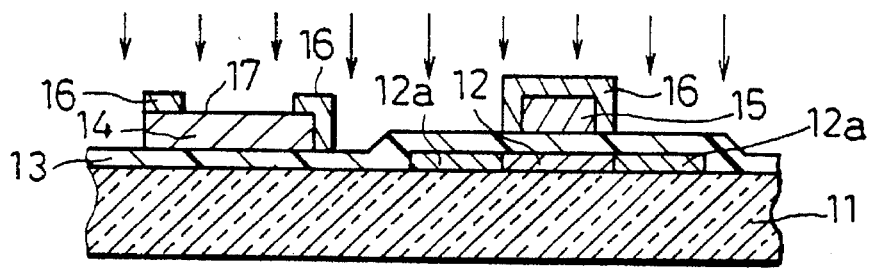
FIG. 13 is a sectional view of the halfway produced semiconductor device which shows the method for producing the semiconductor of FIG. 8.
Figure 14:
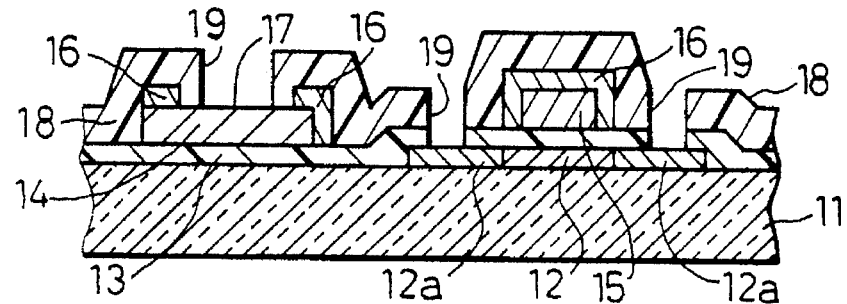
FIG. 14 is a sectional view of the halfway produced semiconductor device which shows the method for producing the semiconductor of FIG. 8.
Figure 17:
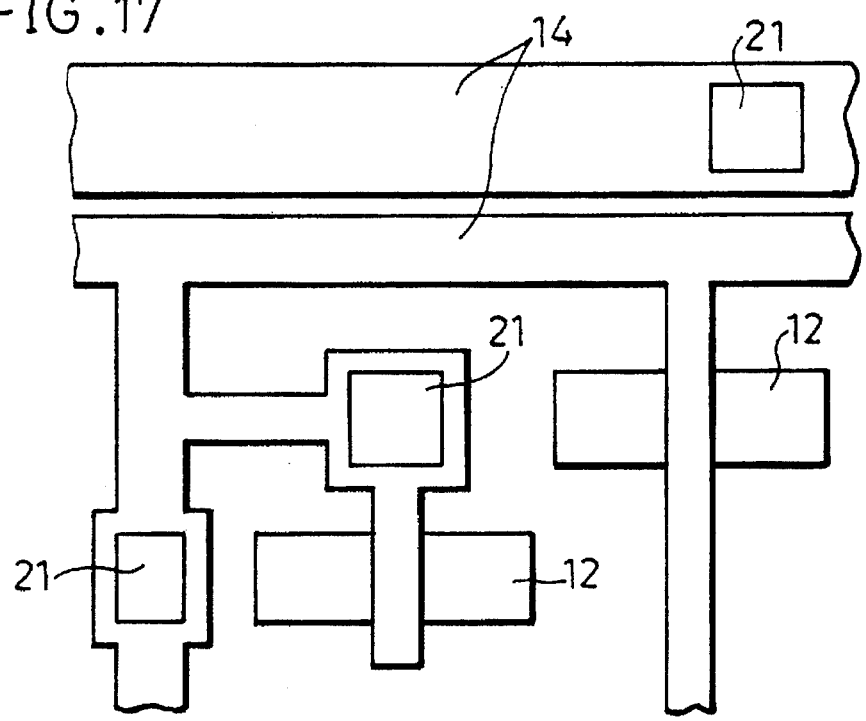
FIG. 17 is a plan view of the halfway produced semiconductor device which shows the method for producing the semiconductor device of FIG. 8.

Next, after resist 21 is patterned on the section to be the non-anodic-oxide section 17 of the gate wiring 14, the gate wiring 14 and the gate electrode 15 are anodically oxidized, and as shown in FIGS. 12 and 17, the metallic oxide layer 16 as the anodic oxide section is formed. The resist 21 becomes a protective film at the time of the anodic oxidation, and the section of the metallic layer covered with the resist 21 is not anodically oxidized. In other words, the section covered with the resist 21 is the non-anodic-oxide section 17 as shown in FIG. 14. In order to reduce time, cost, etc. of the production, it is desirable that general resist used in another process is used as the resist 21.

In addition, as shown in FIG. 17, the resist 21 is formed on the gate wiring 14 so that the resist 21 is entirely positioned on the surface of the gate wiring 14, more preferably the outer edge of the resist 21 is positioned inside the outer edge of the gate wiring 14. As a result, there is no possibility of breaking the resist pattern due to the penetration of the oxide film under the resist 21 at the time of the anodic oxidation of the gate wiring 14. Here, its reason is same as that in the aforementioned embodiment 1. Moreover, the anodic oxidation is performed under the same conditions as that in the embodiment 1.

Figure 18:
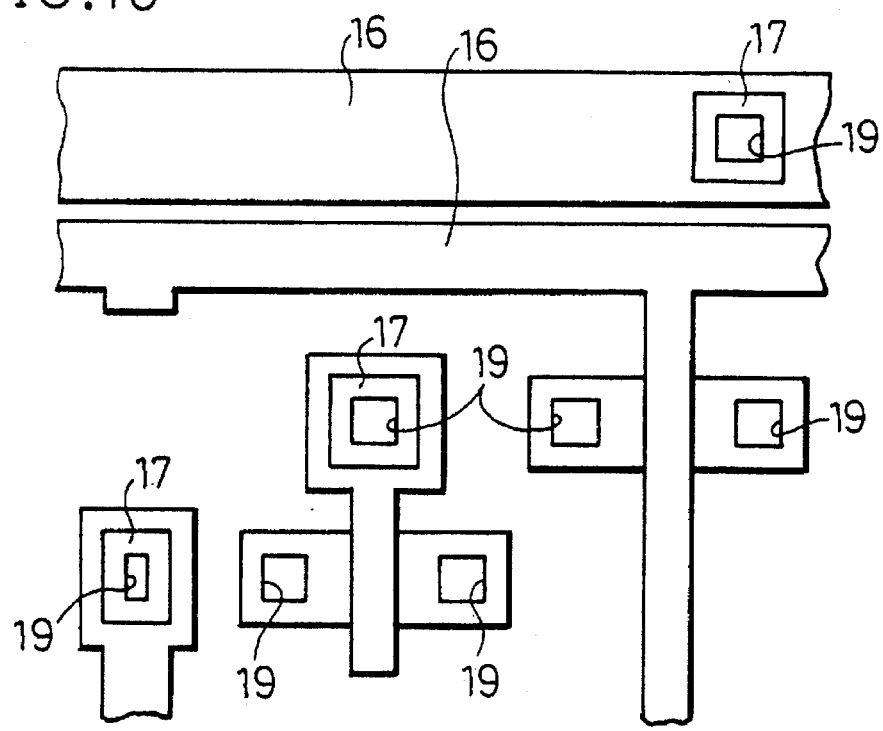
FIG. 18 is a plan view of the halfway produced semiconductor device which shows the method for producing the semiconductor device of FIG. 8.

Next, after the anodic oxidation is completed, as shown in FIG. 18, the resist 21 is removed from the gate wiring 14 and the unnecessary section of the gate wiring 14 is cut-etched so that sections which compose the TFT as each semiconductor element are separated. At this time, the resist 21 and the metallic oxide layer 16 ($Al_2O_3$ film) on the gate wiring 14 are collectively removed, and the metallic layer (Al) is exposed as the non-anodic-oxide section on the section from which the resist 21 and the metallic oxide layer 16 have been removed. For this reason, the non-anodic-oxide section and the anodic oxide section can be formed by the step which is simpler than the step of exposing the metallic layer by selectively etching the anodic oxide layer.

In addition, the channel layer 12 is doped with impurity, such as phosphorus, boron, with high concentration by the ion doping method such that the gate electrode 15 is used as a self aligning pattern. As a result, as shown in FIG. 14, the n+Si or P+Si layer 12a is formed.

In general, in the driver circuit for driving liquid crystal, it is necessary to form an n-type TFT and a p-type TFT on one substrate. In order to do so, when a section is doped with phosphorus, resist is patterned on a section which is doped with boron, and when a section is doped with boron, resist is patterned on a section which is doped with phosphorus. As a result, the n-type TFT and the p-type TFT can be formed on one substrate.

Next, SiNx with a thickness of 300 nm, for example, is formed on the whole surface of the substrate by the sputtering method or the TEOS method or the like so as to be the second insulating layer 18. Patterning and etching are carried out on the second insulating layer 18, and as shown in FIGS. 14 and 18, the contact hole 19 for exposing a part of the gate wiring 14 and of n+Si or p+Si layer 12a is formed. The contact hole 19 exposes the non-anodic-oxide section 17 of the gate wiring 14.

Figure 15:
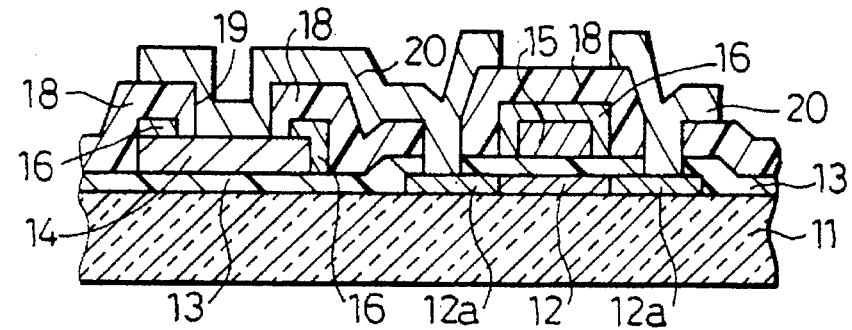
FIG. 15 is a sectional view of the completely produced semiconductor device which shows the method for producing the semiconductor of FIG. 8.
Figure 19:
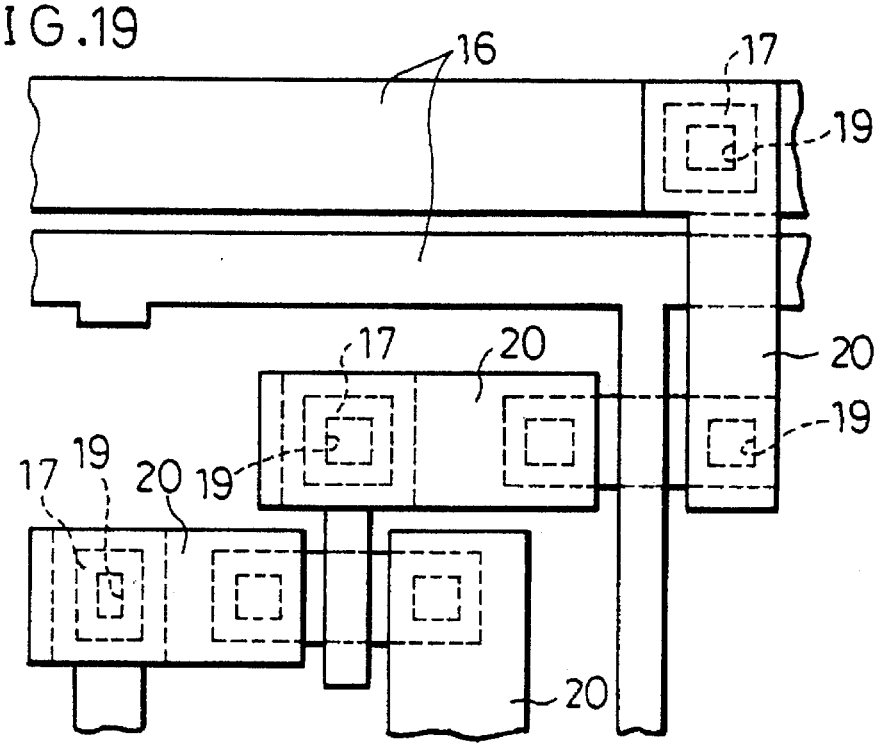
FIG. 19 is a plan view of the completely produced semiconductor device which shows the method for producing the semiconductor device of FIG. 8.

Finally, Al with a thickness of 300 nm is formed by the sputtering method or the TEOS method or the like on the second insulating layer 18, on which the contact hole 19 has been formed. After the resist film is patterned thereon and etching is carried out so that the source/drain electrode wiring 20 is formed as shown in FIGS. 15 and 19. The source/drain electrode wiring 20 is connected to the gate wiring 14 on the non-anodic-oxide section 17 of the gate wiring 14 exposed through the contact hole 19 formed on the gate wiring 14. Moreover, the source/drain electrode wiring 20 is connected to the n+Si or p+Si layer 12a exposed through the contact hole 19 formed on the first insulating layer 13.

As mentioned above, the semiconductor device shown in FIG. 9 is produced by the step of forming the gate wiring 14 of the TFT and the gate electrode 15 as the metallic layers by using metal which can be anodically oxidized, the step of patterning the resist on the gate wiring 14, the step of anodically oxidizing the first metallic layer 2, the step of forming the contact hole 19, which exposes the non-anodic-oxide section 17 of the gate wiring 14 and the n+Si or p+Si layer 12a, on the insulating layer 4 formed on the whole surface of the substrate, and the step of forming the source/drain electrode wiring 20 so as to be connected to the non-anodic-oxide section 1 of the gate wiring 14 and the n+Si or p+Si layer 12a which are exposed through the contact hole 19.

In the semiconductor device produced by the above method, since the metallic oxide layer 16 made of $Al_2O_3$ is formed on the surface of the gate wiring 14 and of the gate electrode 15, the gate wiring 14 and the gate electrode 15 has excellent insulation properties and chemical resistance. Moreover, besides the metallic oxide layer 16, the non-anodic-oxide section 17 is formed on the gate wiring 14, and the non-anodic-oxide section 17 is connected to the source/drain electrode wiring 20, thereby obtaining satisfactory contact.

In addition, with the above producing method, the resist 21 is patterned on the gate wiring 14, namely, the section to be connected to the source/drain electrode wiring 20 is masked, and the gate wiring section 14 is anodically oxidized. Thereafter, the resist 21 is removed so that the non-anodic-oxide section 17 of the gate wiring 14 is partially exposed. In other words, since the process of etching the metallic oxide layer 16 made of $Al_2O_3$ is not included, the steps of the producing method can be decreased and poor contact due to over-etching, etc., which is apt to occur at the time of the step of etching $Al_2O_3$, can be avoided.

In addition, with the producing method explained in the present embodiment, since not only the driver TFT for driving liquid crystal but also the switching TFT in a liquid crystal display can be simultaneously produced, it is possible to simplify the steps of producing the liquid crystal display apparatus, etc. and to shorten the producing time.

As mentioned above, with the present invention, Al can be used for the gate electrode. An $Al_2O_3$ film, which obtained by anodically oxidizing Al, is difficult to be etched. Therefore, when the TFT using the gate electrode made of Al is adopted to the driver circuit for driving liquid crystal, it is possible to eliminate a problem, such as delay of the signal, etc. due to enlargement of the liquid crystal screen.

In addition, with the method for producing the semiconductor apparatus, the resist 21 to be patterned on the gate wiring 14 is formed such that it is entirely positioned on the surface of the gate wiring 14, more preferably the outer edge of the resist 21 is positioned inside the outer edge of the gate wiring 14. This makes it possible to restrain the progress of the anodic oxidation into the section of the gate wiring 14 covered with the resist 21, namely, the penetration.

As a result, the non-anodic-oxide section 17 can be formed without breaking the resist pattern formed on the gate wiring 14, thereby making it possible to eliminate poor contact between the gate wiring 14 and the source/drain electrode wiring 20. Further, it is not necessary to use resist having strong adhesion for restraining the progress of the anodic oxidation, so conventional resist can be used, thereby making it possible to restrain increase in the cost of the production.

Here, in the present embodiment, Al was used as the gate wiring 14 and the gate electrode 15, but the present invention is not limited to this. Therefore, even when metal which can be anodically oxidized, such as Ta, Ti, Cr, or alloy mainly containing metal, such as Al, Ta, Ti, Cr is used, the same effect as that of the present embodiment can be obtained.

In addition, the method for producing the semiconductor device is not limited to the present embodiment, so any method may be adopted as long as the method shows the same effect as the above.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A metallic wiring substrate, comprising:

an insulating substrate;

a first metallic layer comprised of an anodic oxide section and a non-anodic-oxide section, said first metallic layer being provided on said insulating substrate; and a second metallic layer connected to the non-anodic-oxide section of said first metallic layer;

wherein on the surface of said first metallic layer, an outer circumference of the non-anodic-oxide section is surrounded by the anodic oxide section and the non-anodic-oxide section is formed on a portion covered with resist, which was patterned so as to be completely positioned on the surface of the first metallic layer without exceeding the surface of the first metallic layer when the first metallic layer was anodically oxidized, said resist being removed after the first metallic layer is anodically oxidized.

2. The metallic wiring substrate as defined in claim 1, further comprising a thin film transistor, wherein said first metallic layer is a gate wiring of said thin film transistor, wherein said second metallic layer is a source electrode and drain electrode wiring of said thin film transistor.

3. The metallic wiring substrate as defined in claim 1, wherein said first metallic layer is made of Al.

4. The metallic wiring substrate as defined in claim 1, wherein said first metallic layer is made of alloy mainly containing metal which can be anodically oxidized.

5. The metallic wiring substrate as defined in claim 4, wherein the metal is Al.

6. The metallic wiring substrate as defined in claim 1, further comprising an insulating layer having a contact hole, through which the non-anodic-oxide section of said first metallic layer and said second metallic layer are connected.

* * * * *